(12) United States Patent
Chou et al.

(10) Patent No.: US 7,351,668 B2
(45) Date of Patent: *Apr. 1, 2008

(54) FILM FORMATION METHOD AND APPARATUS FOR SEMICONDUCTOR PROCESS

(75) Inventors: Pao-Hwa Chou, Kai (JP); Kazuhide Hasebe, Minamialps (JP)

(73) Assignee: Tokyo Electron Limited, Tokyo (JP)

( * ) Notice: Subject to any disclaimer, the term of this patent is extended or adjusted under 35 U.S.C. 154(b) by 179 days.

This patent is subject to a terminal disclaimer.

(21) Appl. No.: 11/368,481

(22) Filed: Mar. 7, 2006

(65) Prior Publication Data

US 2006/0205231 A1 Sep. 14, 2006

(30) Foreign Application Priority Data

Mar. 9, 2005 (JP) .............................. 2005-066340
Jan. 11, 2006 (JP) .............................. 2006-004191

(51) Int. Cl.
*H01L 21/36* (2006.01)
*H01L 21/469* (2006.01)
*H01L 21/31* (2006.01)

(52) U.S. Cl. ...................... 438/770; 438/478; 438/680; 438/788; 438/792; 438/775; 438/758; 257/E21.268; 257/E21.293; 257/E21.101

(58) Field of Classification Search ................ 438/478, 438/680, 782, 792, 770, 775, 758; 257/E21.101, 257/E21.268, E21.293
See application file for complete search history.

(56) References Cited

U.S. PATENT DOCUMENTS 6,815,350 B2    11/2004   Kim et al.
7,273,818 B2 *  9/2007    Kurokawa et al. .......... 438/761
2005/0136657 A1 * 6/2005  Yokoi et al. ................. 438/680
2005/0170617 A1 * 8/2005  Kurokawa et al. .......... 438/483
2005/0227459 A1 * 10/2005 Takahashi et al. .......... 438/486
2005/0233093 A1 * 10/2005 Tada et al. ................... 427/569
2005/0245099 A1 * 11/2005 Endo et al. .................. 438/785
2005/0257774 A1 * 11/2005 Usui et al. ................... 123/456
2005/0282365 A1 * 12/2005 Hasebe et al. .............. 438/513
2005/0287775 A1 * 12/2005 Hasebe et al. .............. 438/503

(Continued)

FOREIGN PATENT DOCUMENTS

JP          2-93071        4/1990

(Continued)

*Primary Examiner*—Michael Lebentritt
*Assistant Examiner*—Mohsen Ahmadi
(74) *Attorney, Agent, or Firm*—Oblon, Spivak, McClelland, Maier & Neustadt, P.C.

(57) ABSTRACT

An insulating film is formed on a target substrate by CVD, in a process field to be selectively supplied with a first process gas containing a silane family gas, a second process gas containing a nitriding or oxynitriding gas, and a third process gas containing a carbon hydride gas. This method alternately includes first to fourth steps. The first step performs supply of the first and third process gases to the field while stopping supply of the second process gas to the process field. The second step stops supply of the first to third process gases to the field. The third step performs supply of the second process gas to the field while stopping supply of the first and third process gases to the field. The fourth step stops supply of the first to third process gases to the field.

22 Claims, 8 Drawing Sheets

U.S. PATENT DOCUMENTS

| | | | |
|---|---|---|---|
| 2006/0032443 A1* | 2/2006 | Hasebe et al. | 118/715 |
| 2006/0128161 A1* | 6/2006 | Shibata et al. | 438/769 |
| 2006/0137709 A1* | 6/2006 | Tamura et al. | 134/1 |
| 2006/0207504 A1* | 9/2006 | Hasebe et al. | 118/715 |

FOREIGN PATENT DOCUMENTS

| | | |
|---|---|---|
| JP | 6-34974 | 2/1994 |
| JP | 6-45256 | 2/1994 |
| JP | 11-87341 | 3/1999 |

* cited by examiner

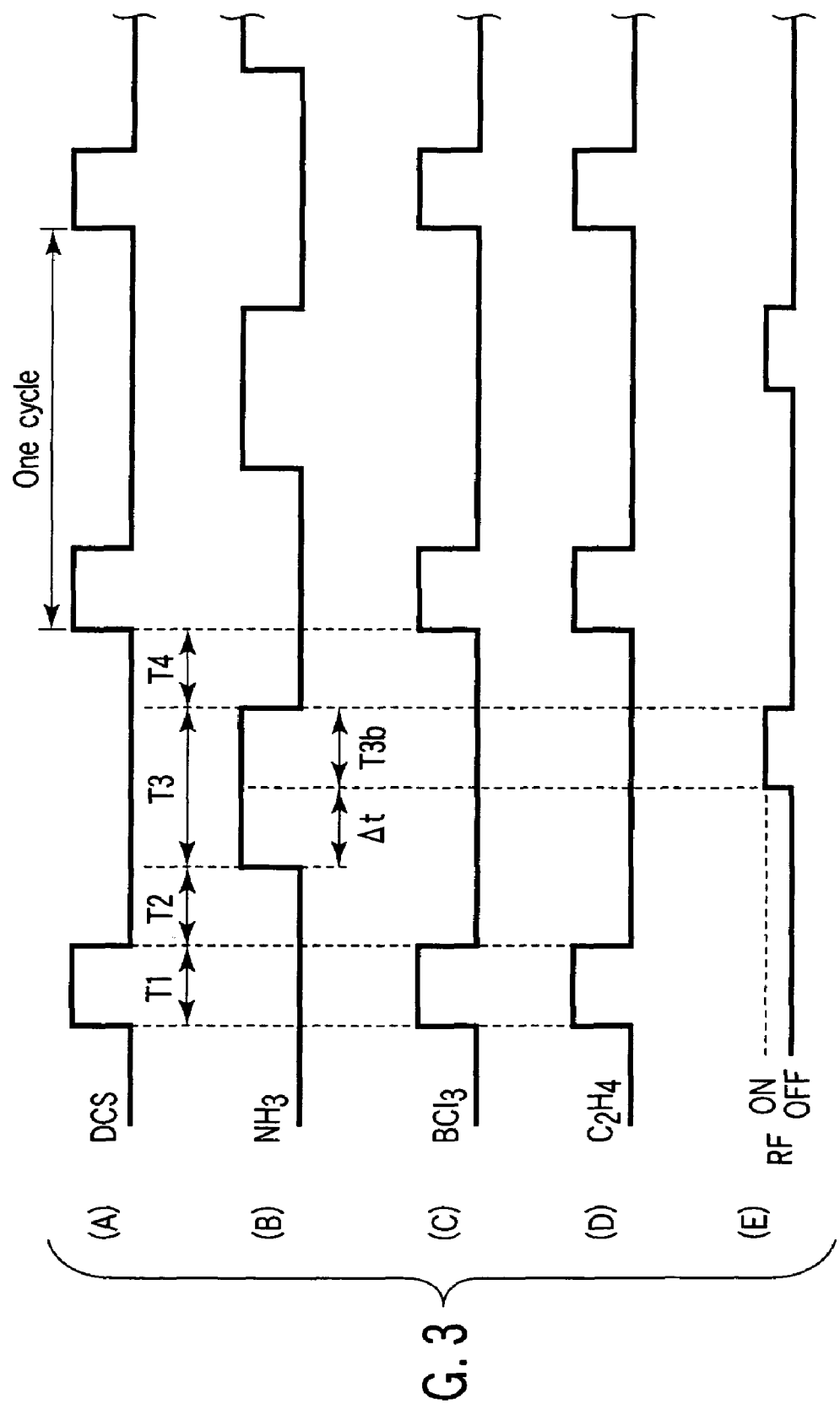
F I G. 3

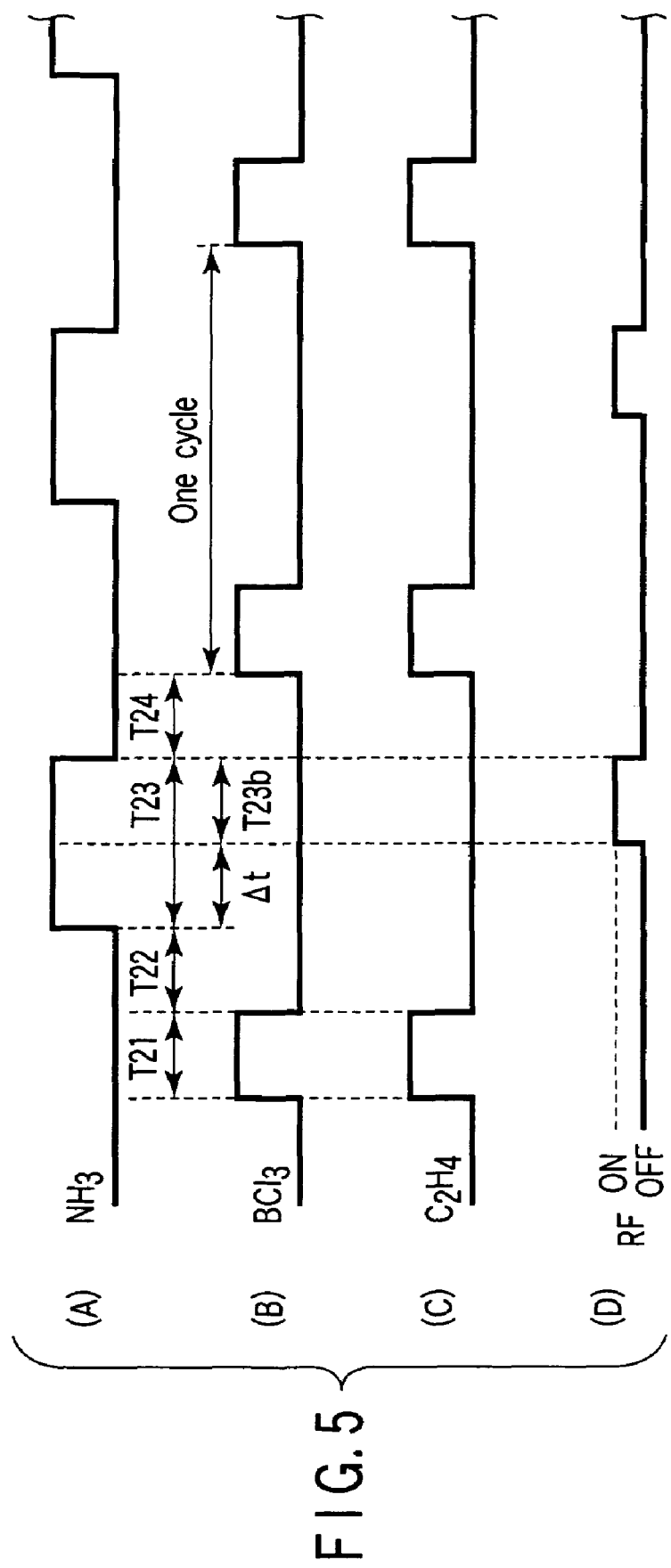
F I G. 5

FILM FORMATION METHOD AND APPARATUS FOR SEMICONDUCTOR PROCESS

CROSS-REFERENCE TO RELATED APPLICATIONS

This application is based upon and claims the benefit of priority from prior Japanese Patent Applications No. 2005-066340, filed Mar. 9, 2005; and No. 2006-004191, filed Jan. 11, 2006, the entire contents of both of which are incorporated herein by reference.

BACKGROUND OF THE INVENTION

1. Field of the Invention

The present invention relates to a film formation method and apparatus for a semiconductor process for forming an insulating film on a target substrate, such as a semiconductor wafer. The term "semiconductor process" used herein includes various kinds of processes which are performed to manufacture a semiconductor device or a structure having wiring layers, electrodes, and the like to be connected to a semiconductor device, on a target substrate, such as a semiconductor wafer or a glass substrate used for an LCD (Liquid Crystal Display) or FPD (Flat Panel Display), by forming semiconductor layers, insulating layers, and conductive layers in predetermined patterns on the target substrate.

2. Description of the Related Art

In manufacturing semiconductor devices for constituting semiconductor integrated circuits, a target substrate, such as a semiconductor wafer, is subjected to various processes, such as film formation, etching, oxidation, diffusion, reformation, annealing, and natural oxide film removal. U.S. 2003/0224618 A1 discloses a semiconductor processing method of this kind performed in a vertical heat-processing apparatus (of the so-called batch type). According to this method, semiconductor wafers are first transferred from a wafer cassette onto a vertical wafer boat and supported thereon at intervals in the vertical direction. The wafer cassette can store, e.g., 25 wafers, while the wafer boat can support 30 to 150 wafers. Then, the wafer boat is loaded into a process container from below, and the process container is airtightly closed. Then, a predetermined heat process is performed, while the process conditions, such as process gas flow rate, process pressure, and process temperature, are controlled.

In order to improve the performance of semiconductor integrated circuits, it is important to improve properties of insulating films used in semiconductor devices. Semiconductor devices include insulating films made of materials, such as $SiO_2$, PSG (Phospho Silicate Glass), P—SiO (formed by plasma CVD), P—SiN (formed by plasma CVD), and SOG (Spin On Glass), $Si_3N_4$ (silicon nitride). Particularly, silicon nitride films are widely used, because they have better insulation properties as compared to silicon oxide films, and they can sufficiently serve as etching stopper films or inter-level insulating films. Further, for the same reason, carbon nitride films doped with boron are sometimes used.

Several methods are known for forming a silicon nitride film on the surface of a semiconductor wafer by thermal CVD (Chemical Vapor Deposition). In such thermal CVD, a silane family gas, such as monosilane ($SiH_4$), dichlorosilane (DCS: $SiH_2Cl_2$), hexachloro-disilane (HCD: $Si_2Cl_6$), or bistertialbutylaminosilane (BTBAS: $SiH_2(NH(C_4H_9)_2)$, is used as a silicon source gas. For example, a silicon nitride film is formed by thermal CVD using a gas combination of $SiH_2Cl_2+NH_3$ (see Jpn. Pat. Appln. KOKAI Publication No. 11-87341) or $Si_2Cl_6+NH_3$. Further, there is also proposed a method for doping a silicon nitride film with an impurity, such as boron (B), to decrease the dielectric constant (see U.S. Pat. No. 6,815,350 B2).

In recent years, owing to the demands of increased miniaturization and integration of semiconductor integrated circuits, it is required to alleviate the thermal history of semiconductor devices in manufacturing steps, thereby improving the characteristics of the devices. For vertical processing apparatuses, it is also required to improve semiconductor processing methods in accordance with the demands described above. For example, there is a CVD (Chemical Vapor Deposition) method for a film formation process, which performs film formation while intermittently supplying a source gas and so forth to repeatedly form layers each having an atomic or molecular level thickness, one by one, or several by several (for example, Jpn. Pat. Appln. KOKAI Publication Nos. 6-45256 and 11-87341). In general, this film formation method is called ALD (Atomic layer Deposition), which allows a predetermined process to be performed without exposing wafers to a very high temperature.

For example, where dichlorosilane (DCS) and $NH_3$ are supplied as a silane family gas and a nitriding gas, respectively, to form a silicon nitride film (SiN), the process is performed, as follows. Specifically, DCS and $NH_3$ gas are alternately and intermittently supplied into a process container with purge periods interposed therebetween. When $NH_3$ gas is supplied, an RF (radio frequency) is applied to generate plasma within the process container so as to promote a nitridation reaction. More specifically, when DCS is supplied into the process container, a layer with a thickness of one molecule or more of DCS is adsorbed onto the surface of wafers. The superfluous DCS is removed during the purge period. Then, $NH_3$ is supplied and plasma is generated, thereby performing low temperature nitridation to form a silicon nitride film. These sequential steps are repeated to complete a film having a predetermined thickness.

When an insulating film as one of those described above is formed and then another thin film is formed thereon, contaminants such as organic substances and particles may have stuck to the surface of the insulating film. Accordingly, a cleaning process is performed to remove the contaminants, as needed. In this cleaning process, the semiconductor wafer is immersed in a cleaning solution, such as dilute hydrofluoric acid, to perform etching on the surface of the insulating film. Consequently, the surface of the insulating film is etched by a very small amount, thereby removing the contaminants.

Where such an insulating film is formed by CVD at a higher process temperature of, e.g., about 760° C., the etching rate of the insulating film during the cleaning process is very small. Accordingly, the insulating film is not excessively etched by cleaning, and thus the cleaning process is performed with high controllability in the film thickness. However, where a thin film having a low heat resistance is present as an underlayer, a thermal CVD process at high temperature is unsuitable.

On the other hand, where such an insulating film is formed by ALD film formation at a lower process temperature of, e.g., about 400° C., the etching rate of the insulating film during the cleaning process is relatively large. Accordingly, the insulating film may be excessively etched by cleaning, and thus the cleaning process entails lower controllability in the film thickness.

Further, a silicon nitride film may be used as an etching stopper film or inter-level insulating film. In this case, the etching rate of the silicon nitride film must be very low. However, the conventional film formation method cannot satisfy this requirement.

BRIEF SUMMARY OF THE INVENTION

An object of the present invention is to provide a method and apparatus for forming an insulating film, which can employ a relatively low process temperature in film formation, and cause the film to be etched by a low amount during a cleaning process, so that the cleaning process can be performed with high controllability in the film thickness, while allowing the film to sufficiently serve as an etching stopper film or inter-level insulating film. It should be noted that the present invention is a modification of the invention disclosed in Jpn. Pat. Appln. KOKAI Publication No. 2003-282566 (Oct. 3, 2003).

According to a first aspect of the present invention, there is provided a film formation method for a semiconductor process for forming an insulating film on a target substrate by CVD, in a process field configured to be selectively supplied with a first process gas containing a silane family gas, a second process gas containing a nitriding gas or oxynitriding gas, and a third process gas containing a carbon hydride gas, the method alternately comprising:

a first step of performing supply of the first and third process gases to the process field while stopping supply of the second process gas to the process field;

a second step of stopping supply of the first, second, and third process gases to the process field;

a third step of performing supply of the second process gas to the process field while stopping supply of the first and third process gases to the process field; and a fourth step of stopping supply of the first, second, and third process gases to the process field.

According to a second aspect of the present invention, there is provided a film formation method for a semiconductor process for forming an insulating film on a target substrate by CVD, in a process field configured to be selectively supplied with a first process gas containing a carbon hydride gas, a second process gas containing a nitriding gas or oxynitriding gas, and a third process gas containing a boron-containing gas, the method alternately comprising:

a first step of performing supply of the first and third process gases to the process field while stopping supply of the second process gas to the process field;

a second step of stopping supply of the first, second, and third process gases to the process field;

a third step of performing supply of the second process gas to the process field while stopping supply of the first and third process gases to the process field; and a fourth step of stopping supply of the first, second, and third process gases to the process field.

According to a third aspect of the present invention, there is provided a film formation apparatus for a semiconductor process, comprising:

a process container having a process field configured to accommodate a target substrate;

a support member configured to support the target substrate inside the process field;

a heater configured to heat the target substrate inside the process field;

an exhaust system configured to exhaust gas inside the process field;

a first process gas supply circuit configured to supply a first process gas containing a silane family gas to the process field;

a second process gas supply circuit configured to supply a second process gas containing a nitriding gas or oxynitriding gas to the process field;

a third process gas supply circuit configured to supply a third process gas containing a carbon hydride gas to the process field; and a control section configured to control an operation of the apparatus, wherein, in order to form an insulating film on the target substrate by CVD, the control section alternately executes a first step of performing supply of the first and third process gases to the process field while stopping supply of the second process gas to the process field;

a second step of stopping supply of the first, second, and third process gases to the process field;

a third step of performing supply of the second process gas to the process field while stopping supply of the first and third process gases to the process field; and a fourth step of stopping supply of the first, second, and third process gases to the process field.

According to a fourth aspect of the present invention, there is provided a film formation apparatus for a semiconductor process, comprising:

a process container having a process field configured to accommodate a target substrate;

a support member configured to support the target substrate inside the process field;

a heater configured to heat the target substrate inside the process field;

an exhaust system configured to exhaust gas inside the process field;

a first process gas supply circuit configured to supply a first process gas containing a carbon hydride gas to the process field;

a second process gas supply circuit configured to supply a second process gas containing a nitriding gas or oxynitriding gas to the process field;

a third process gas supply circuit configured to supply a third process gas containing a boron-containing gas to the process field; and a control section configured to control an operation of the apparatus, wherein, in order to form an insulating film on the target substrate by CVD, the control section alternately executes a first step of performing supply of the first and third process gases to the process field while stopping supply of the second process gas to the process field;

a second step of stopping supply of the first, second, and third process gases to the process field;

a third step of performing supply of the second process gas to the process field while stopping supply of the first and third process gases to the process field; and a fourth step of stopping supply of the first, second, and third process gases to the process field.

According to a fifth aspect of the present invention, there is provided a computer readable medium containing program instructions for execution on a processor, which is used for a film formation apparatus for a semiconductor process for forming an insulating film on a target substrate by CVD, in a process field configured to be selectively supplied with a first process gas containing a silane family gas, a second process gas containing a nitriding gas or oxynitriding gas, and a third process gas containing a carbon hydride gas, wherein the program instructions, when executed by the processor, cause the film formation apparatus to execute a first step of performing supply of the first and third process gases to the process field while stopping supply of the second process gas to the process field;

a second step of stopping supply of the first, second, and third process gases to the process field;

a third step of performing supply of the second process gas to the process field while stopping supply of the first and third process gases to the process field; and a fourth step of stopping supply of the first, second, and third process gases to the process field.

According to a sixth aspect of the present invention, there is provided a computer readable medium containing program instructions for execution on a processor, which is used for a film formation apparatus for a semiconductor process for forming an insulating film on a target substrate by CVD, in a process field configured to be selectively supplied with a first process gas containing a carbon hydride gas, a second process gas containing a nitriding gas or oxynitriding gas, and a third process gas containing a boron-containing gas, wherein the program instructions, when executed by the processor, cause the film formation apparatus to execute a first step of performing supply of the first and third process gases to the process field while stopping supply of the second process gas to the process field;

a second step of stopping supply of the first, second, and third process gases to the process field;

a third step of performing supply of the second process gas to the process field while stopping supply of the first and third process gases to the process field; and a fourth step of stopping supply of the first, second, and third process gases to the process field.

Additional objects and advantages of the invention will be set forth in the description which follows, and in part will be obvious from the description, or may be learned by practice of the invention. The objects and advantages of the invention may be realized and obtained by means of the instrumentalities and combinations particularly pointed out hereinafter.

BRIEF DESCRIPTION OF THE SEVERAL VIEWS OF THE DRAWING

The accompanying drawings, which are incorporated in and constitute a part of the specification, illustrate embodiments of the invention, and together with the general description given above and the detailed description of the embodiments given below, serve to explain the principles of the invention.

FIG. 3 is a timing chart of the gas supply and RF (radio frequency) application of a film formation method according to a first embodiment of the present invention;

FIG. 5 is a timing chart of the gas supply and RF (radio frequency) application of a film formation method according to a third embodiment of the present invention;

DETAILED DESCRIPTION OF THE INVENTION

Figure 1:
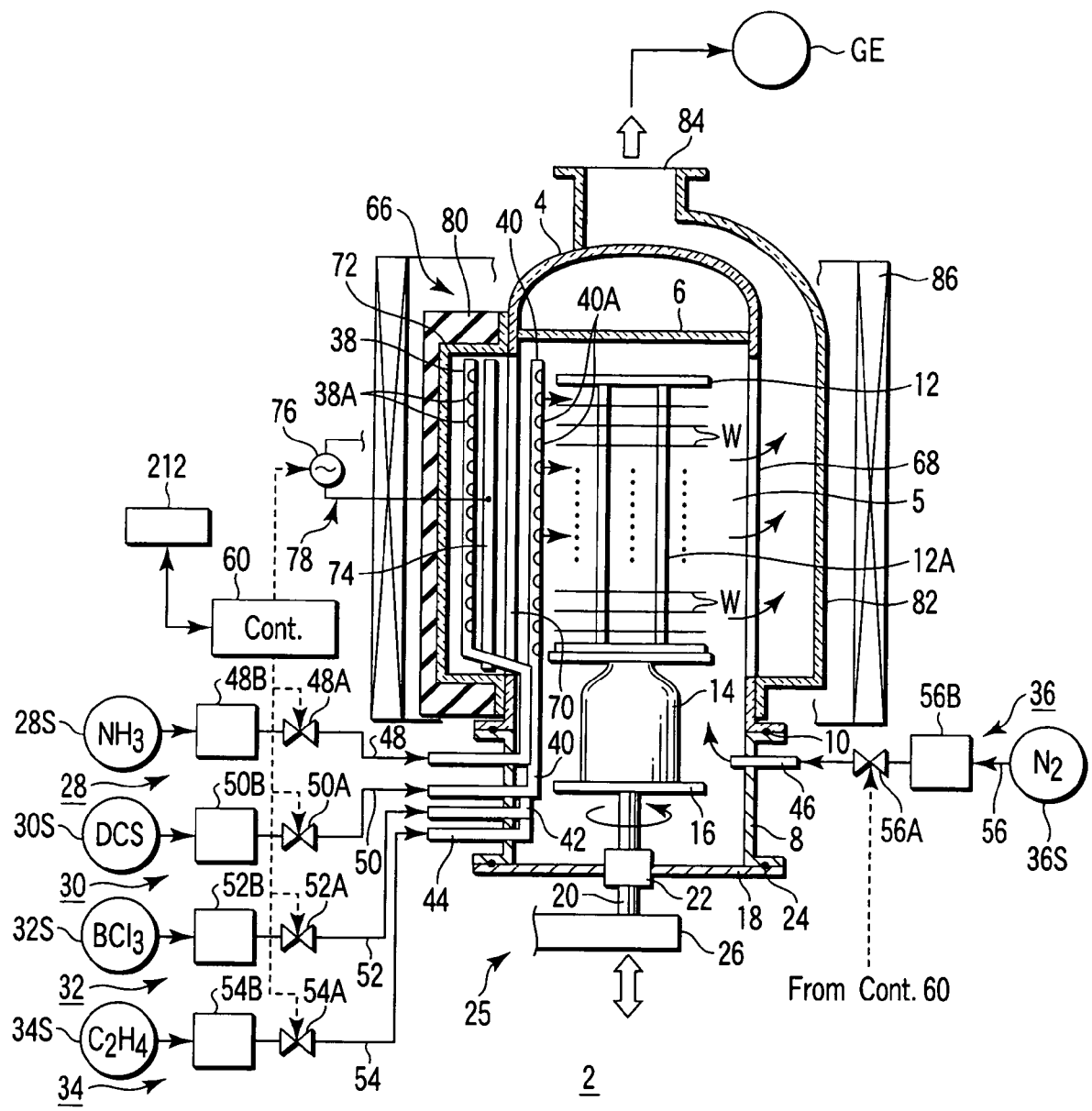
FIG. 1 is a sectional view showing a film formation apparatus (vertical CVD apparatus) according to an embodiment of the present invention.

Embodiments of the present invention will now be described with reference to the accompanying drawings. In the following description, the constituent elements having substantially the same function and arrangement are denoted by the same reference numerals, and a repetitive description will be made only when necessary.

Figure 2:
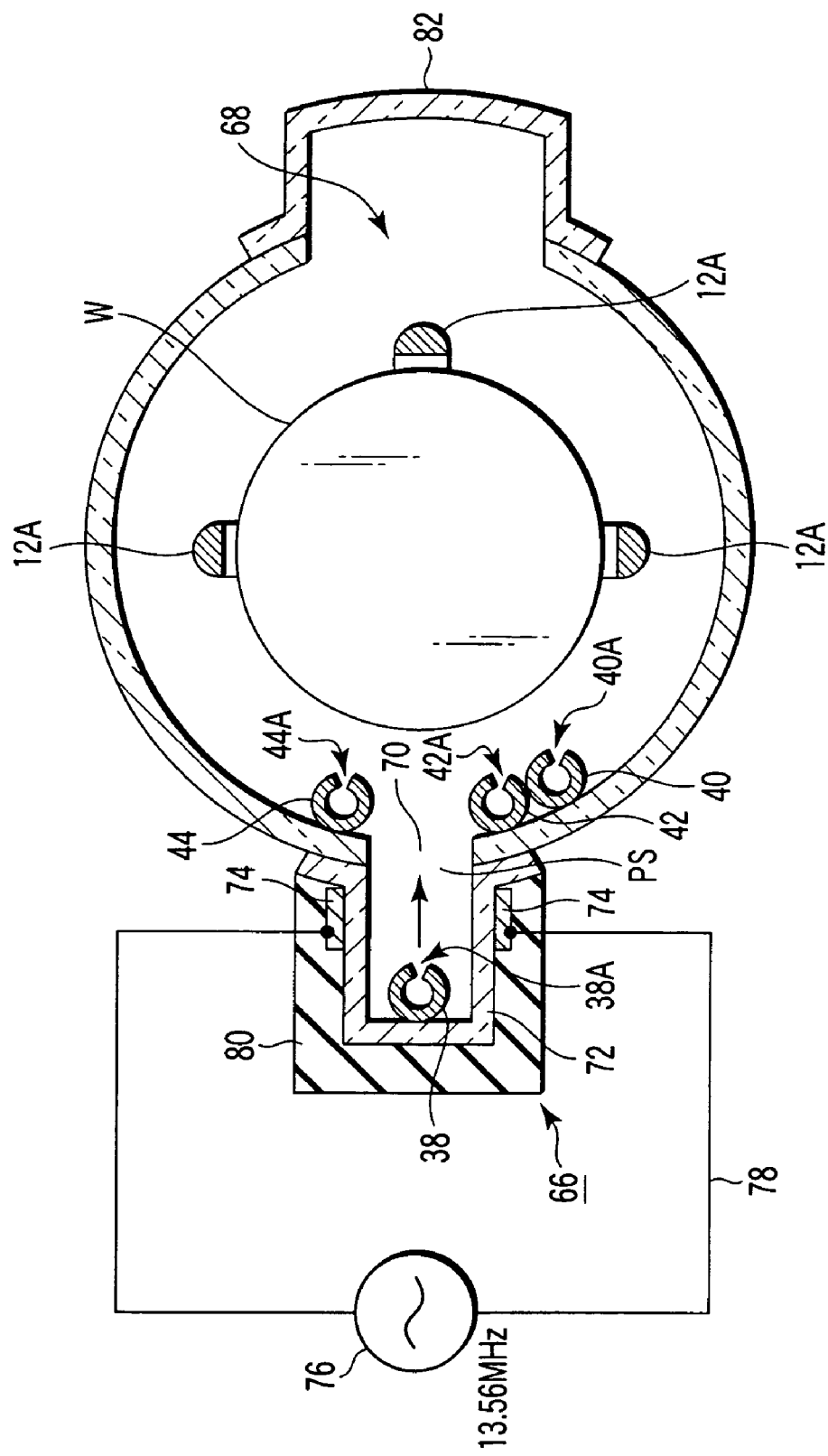
FIG. 2 is a sectional plan view showing part of the apparatus shown in FIG. 1.

FIG. 1 is a sectional view showing a film formation apparatus (vertical CVD apparatus) according to an embodiment of the present invention. FIG. 2 is a sectional plan view showing part of the apparatus shown in FIG. 1. The film formation apparatus 2 has a process field configured to be selectively supplied with a first process gas containing dichlorosilane (DCS) gas as a silane family gas, a second process gas containing ammonia ($NH_3$) gas as a nitriding gas, a third process gas containing $C_2H_4$ gas (ethylene gas) as a carbon hydride gas, and a fourth process gas containing $BCl_3$ gas as a boron-containing gas. The film formation apparatus 2 is configured to form an insulating film containing carbon on target substrates by CVD in the process field. It should be noted that, although the film formation apparatus 2 described below includes supply circuits for all the gases described above, the embodiments described later include cases where some of the gases are not used. If an apparatus is constructed to be exclusively used for a specific embodiment, the supply circuits for unused gases may be omitted.

The apparatus 2 includes a process container 4 shaped as a cylindrical column with a ceiling and an opened bottom, in which a process field 5 is defined to accommodate and process a plurality of semiconductor wafers (target substrates) stacked at intervals in the vertical direction. The entirety of the process container 4 is made of, e.g., quartz. The top of the process container 4 is provided with a quartz ceiling plate 6 to airtightly seal the top. The bottom of the process container 4 is connected through a seal member 10, such as an O-ring, to a cylindrical manifold 8. The process container may be entirely formed of a cylindrical quartz column without a manifold 8 separately formed.

The manifold 8 is made of, e.g., stainless steel, and supports the bottom of the process container 4. A wafer boat 12 made of quartz is moved up and down through the bottom port of the manifold 8, so that the wafer boat 12 is loaded/unloaded into and from the process container 4. A number of target substrates or semiconductor wafers W are stacked on a wafer boat 12. For example, in this embodiment, the wafer boat 12 has struts 12A that can support, e.g., about 50 to 100 wafers having a diameter of 300 mm at essentially regular intervals in the vertical direction.

The wafer boat 12 is placed on a table 16 through a heat-insulating cylinder 14 made of quartz. The table 16 is supported by a rotary shaft 20, which penetrates a lid 18 made of, e.g., stainless steel, and is used for opening/closing the bottom port of the manifold 8.

The portion of the lid 18 where the rotary shaft 20 penetrates is provided with, e.g., a magnetic-fluid seal 22, so that the rotary shaft 20 is rotatably supported in an airtightly sealed state. A seal member 24, such as an O-ring, is interposed between the periphery of the lid 18 and the bottom of the manifold 8, so that the interior of the process container 4 can be kept sealed.

The rotary shaft 20 is attached at the distal end of an arm 26 supported by an elevating mechanism 25, such as a boat elevator. The elevating mechanism 25 moves the wafer boat 12 and lid 18 up and down integratedly. The table 16 may be fixed to the lid 18, so that wafers W are processed without rotation of the wafer boat 12.

A gas supply section is connected to the side of the manifold 8 to supply predetermined process gases to the process field 5 within the process container 4. Specifically, the gas supply section includes a second process gas supply circuit 28, a first process gas supply circuit 30, a fourth process gas supply circuit 32, a third process gas supply circuit 34, and a purge gas supply circuit 36. The first process gas supply circuit 30 is arranged to supply a first process gas containing a silane family gas, such as DCS (dichlorosilane) gas. The second process gas supply circuit 28 is arranged to supply a second process gas containing a nitriding gas, such as ammonia ($NH_3$) gas. The third process gas supply circuit 34 is arranged to supply a third process gas containing a carbon hydride gas, such as $C_2H_4$ gas (ethylene gas). The fourth process gas supply circuit 32 is arranged to supply a fourth process gas containing a boron-containing gas (doping gas), such as $BCl_3$ gas. The purge gas supply circuit 36 is arranged to supply an inactive gas, such as $N_2$ gas, as a purge gas. Each of the first to fourth process gases is mixed with a suitable amount of carrier gas, as needed. However, such a carrier gas will not be mentioned, hereinafter, for the sake of simplicity of explanation.

More specifically, the second, first, fourth, and third process gas supply circuits 28, 30, 32, and 34 include gas distribution nozzles 38, 40, 42 and 44, respectively, each of which is formed of a quartz pipe which penetrates the sidewall of the manifold 8 from the outside and then turns and extends upward (see FIG. 1). The gas distribution nozzles 38, 40, 42 and 44 respectively have a plurality of gas spouting holes 38A, 40A, 42A, and 44A, each set of holes being formed at predetermined intervals in the longitudinal direction (the vertical direction) over all the wafers. W on the wafer boat 12. Each of the gas spouting holes 38A, 40A, 42A, and 44A delivers the corresponding process gas almost uniformly in the horizontal direction, so as to form gas flows parallel with the wafers W on the wafer boat 12. The purge gas supply circuit 36 includes a short gas nozzle 46, which penetrates the sidewall of the manifold 8 from the outside.

The nozzles 38, 40, 42, 44, and 46 are connected to gas sources 28S, 30S, 32S, 34S, and 36S of $NH_3$ gas, DCS gas, $BCl_3$ gas, $C_2H_4$ gas, and $N_2$ gas, respectively, through gas supply lines (gas passages) 48, 50, 52, 54, and 56, respectively. The gas supply lines 48, 50, 52, 54, and 56 are provided with switching valves 48A, 50A, 52A, 54A, and 56A and flow rate controllers 48B, 50B, 52B, 54B, and 56B, such as mass flow controllers, respectively. With this arrangement, $NH_3$ gas, DCS gas, $BCl_3$ gas, $C_2H_4$ gas, and $N_2$ gas can be supplied at controlled flow rates.

A gas exciting section 66 is formed at the sidewall of the process container 4 in the vertical direction. On the side of the process container 4 opposite to the gas exciting section 66, a long and thin exhaust port 68 for vacuum-exhausting the inner atmosphere is formed by cutting the sidewall of the process container 4 in, e.g., the vertical direction.

Specifically, the gas exciting section 66 has a vertically long and thin opening 70 formed by cutting a predetermined width of the sidewall of the process container 4, in the vertical direction. The opening 70 is covered with a quartz cover 72 airtightly connected to the outer surface of the process container 4 by welding. The cover 72 has a vertical long and thin shape with a concave cross-section, so that it projects outward from the process container 4.

With this arrangement, the gas exciting section 66 is formed such that it projects outward from the sidewall of the process container 4 and is opened on the other side to the interior of the process container 4. In other words, the inner space of the gas exciting section 66 communicates with the process field 5 within the process container 4. The opening 70 has a vertical length sufficient to cover all the wafers W on the wafer boat 12 in the vertical direction.

A pair of long and thin electrodes 74 are disposed on the opposite outer surfaces of the cover 72, and face each other in the longitudinal direction (the vertical direction). The electrodes 74 are connected to an RF (Radio Frequency) power supply 76 for plasma generation, through feed lines 78. An RF voltage of, e.g., 13.56 MHz is applied to the electrodes 74 to form an RF electric field for exciting plasma between the electrodes 74. The frequency of the RF voltage is not limited to 13.56 MHz, and it may be set at another frequency, e.g., 400 kHz.

The gas distribution nozzle 38 of the second process gas is bent outward in the radial direction of the process container 4, at a position lower than the lowermost wafer W on the wafer boat 12. Then, the gas distribution nozzle 38 vertically extends at the deepest position (the farthest position from the center of the process container 4) in the gas exciting section 66. As shown also in FIG. 2, the gas distribution nozzle 38 is separated outward from an area sandwiched between the pair of electrodes 74 (a position where the RF electric field is most intense), i.e., a plasma generation area PS where the main plasma is actually generated. The second process gas containing $NH_3$ gas is spouted from the gas spouting holes 38A of the gas distribution nozzle 38 toward the plasma generation area PS. Then, the second process gas is excited (decomposed or activated) in the plasma generation area PS, and is supplied in this state onto the wafers W on the wafer boat 12.

An insulating protection cover 80 made of, e.g., quartz is attached on and covers the outer surface of the cover 72. A cooling mechanism (not shown) is disposed in the insulating protection cover 80 and comprises coolant passages respectively facing the electrodes 74. The coolant passages are supplied with a coolant, such as cooled nitrogen gas, to cool the electrodes 74. The insulating protection cover 80 is covered with a shield (not shown) disposed on the outer surface to prevent RF leakage.

At positions near and outside the opening 70 of the gas exciting section 66, the gas distribution nozzles 40, 42, and 44 of the first, fourth, and third process gases are disposed. Specifically, the gas distribution nozzles 40 and 42 extend upward on one side of the outside of the opening 70 (in the process container 4), and the gas distribution nozzle 44 extends upward on the other side to face them. The first process gas containing DCS gas, the fourth process gas containing $BCl_3$ gas, and the third process gas containing $C_2H_4$ gas are spouted from the gas spouting holes 40A, 42A, and 44A of the gas distribution nozzles 40, 42, and 44, respectively, toward the center of the process container 4.

On the other hand, the exhaust port 68, which is formed opposite the gas exciting section 66, is covered with an exhaust port cover member 82. The exhaust port cover member 82 is made of quartz with a U-shape cross-section, and attached by welding. The exhaust cover member 82 extends upward along the sidewall of the process container 4, and has a gas outlet 84 at the top of the process container 4. The gas outlet 84 is connected to a vacuum-exhaust system GE including a vacuum pump and so forth.

The process container 4 is surrounded by a heater 86, which is used for heating the atmosphere within the process container 4 and the wafers W. A thermocouple (not shown) is disposed near the exhaust port 68 in the process container 4 to control the heater 86.

The film formation apparatus 2 further includes a main control section 60 formed of, e.g., a computer, to control the entire apparatus. The main control section 60 can control the film formation process described below in accordance with the process recipe of the film formation process concerning, e.g., the film thickness and composition of a film to be formed, stored in the memory 212 thereof in advance. In the memory 212, the relationship between the process gas flow rates and the thickness and composition of the film is also stored as control data in advance. Accordingly, the main control section 60 can control the elevating mechanism 25, gas supply circuits 28, 30, 32, 34, and 36, exhaust system GE, gas exciting section 66, heater 86, and so forth, based on the stored process recipe and control data.

Next, an explanation will be given of a film formation method (so called ALD (Atomic Layer Deposition) film formation) performed in the apparatus shown in FIG. 1.

FIRST EMBODIMENT

In the film formation method according to a first embodiment, an insulating film of SiBCN (boron doped silicon carbon nitride) is formed on semiconductor wafers by CVD. In order to achieve this, a first process gas containing dichlorosilane (DCS) gas as a silane family gas, a second process gas containing ammonia ($NH_3$) gas as a nitriding gas, a third process gas containing $C_2H_4$ gas (ethylene gas) as a carbon hydride gas, and a fourth process gas containing $BCl_3$ gas as a boron-containing gas are selectively supplied into the process field 5 accommodating wafers W.

At first, the wafer boat 12 at room temperature, which supports a number of, e.g., 50 to 100, wafers having a diameter of 300 mm, is loaded into the process container 4 heated at a predetermined temperature, and the process container 4 is airtightly closed. Then, the interior of the process container 4 is vacuum-exhausted and kept at a predetermined process pressure, and the wafer temperature is increased to a process temperature for film formation. At this time, the apparatus is in a waiting state until the temperature becomes stable. Then, while the wafer boat 12 is rotated, the first to fourth process gases are intermittently supplied from the respective gas distribution nozzles 40, 38, 44, and 42 at controlled flow rates.

Specifically, the first process gas containing DCS gas, the third process gas containing $C_2H_4$ gas, and the fourth process gas containing $BCl_3$ gas are supplied from the gas spouting holes 40A, 44A, and 42A of the gas distribution nozzles 40, 44, and 42, respectively, to form gas flows parallel with the wafers W on the wafer boat 12. While being supplied, molecules of DCS gas, $C_2H_4$ gas and $BCl_3$ gas and molecules and atoms of decomposition products generated by their decomposition are adsorbed on the wafers W.

On the other hand, the second process gas containing $NH_3$ gas is supplied from the gas spouting holes 38A of the gas distribution nozzle 38 to form gas flows parallel with the wafers W on the wafer boat 12. The second process gas is selectively excited and partly turned into plasma when it passes through the plasma generation area PS between the pair of electrodes 74. At this time, for example, radicals (activated species), such as N*, NH*, $NH_2$*, and $NH_3$*, are produced (the symbol [*] denotes that it is a radical). The radicals flow out from the opening 70 of the gas exciting section 66 toward the center of the process container 4, and are supplied into gaps between the wafers W in a laminar flow state.

The radicals react with molecules of DCS gas and $C_2H_4$ gas adsorbed on the surface of the wafers W, so that a thin film is formed on the wafers W. Further, at this time, B atoms generated by decomposition of $BCl_3$ gas are taken into the thin film, so a film of SiBCN doped with boron as an impurity is formed. Alternatively, when DCS gas, $C_2H_4$ gas, and $BCl_3$ gas flow onto radicals adsorbed on the surface of the wafers W, the same reaction is caused, so a SiBCN film doped with boron is formed on the wafers W.

FIG. 3 is a timing chart of the gas supply and RF (radio frequency) application of a film formation method according to the first embodiment of the present invention. As shown in FIG. 3, the film formation method according to this embodiment is arranged to alternately repeat first to fourth steps T1 to T4. A cycle comprising the first to fourth steps T1 to T4 is repeated a number of times, and thin films of SIBCN formed by respective cycles are laminated, thereby arriving at an SiBCN film having a target thickness.

Specifically, the first step T1 is arranged to perform supply of the first process gas (denoted as DCS in FIG. 3), the third process gas (denoted as $C_2H_4$ in FIG. 3), and the fourth process gas (denoted as $BCl_3$ in FIG. 3) to the process field 5, while stopping supply of the second process gas (denoted as $NH_3$ in FIG. 3) to the process field 5. The second step T2 is arranged to stop supply of the first, second, third, and fourth process gases to the process field 5. The third step T3 is arranged to perform supply of the second process gas to the process field 5, while stopping supply of the first, third, and fourth process gases to the process field 5. Further, halfway through the third step T3, the RF power supply 76 is set in the ON state to turn the second process gas into plasma by the gas exciting section 66, so as to supply the second process gas in an activated state to the process field 5 during a sub-step T3b. The fourth step T4 is arranged to stop supply of the first, second, third, and fourth process gases to the process field 5.

In the third step T3, the RF power supply 76 is turned on after a predetermined time Δt passes, to turn the second process gas into plasma by the gas exciting section 66, so as to supply the second process gas in an activated state to the process field 5 during the sub-step T3b. The predetermined time Δt is defined as the time necessary for stabilizing the flow rate of $NH_3$ gas, which is set at, e.g., about 5 seconds. However, the second process gas may be turned into plasma by the gas exciting section 66 over the entire period of supplying the second process gas. Since the RF power supply is turned on to generate plasma after the flow rate of the second process gas is stabilized, the uniformity of radical concentration among the wafers W (uniformity in the vertical direction) is improved.

Each of the second and fourth steps T2 and T4 is used as a purge step to remove the residual gas within the process container 4. The term "purge" means removal of the residual gas within the process container 4 by vacuum-exhausting the interior of the process container 4 while supplying an inactive gas, such as $N_2$ gas, into the process container 4, or by vacuum-exhausting the interior of the process container 4 while stopping supply of all the gases. In this respect, the second and fourth steps T2 and T4 may be arranged such that the first half utilizes only vacuum-exhaust and the second half utilizes both vacuum-exhaust and inactive gas supply. Further, the first and third steps T1 and T3 may be arranged to stop vacuum-exhausting the process container 4 while supplying each of the first to fourth process gases. However, where supplying each of the first to fourth process gases is performed along with vacuum-exhausting the process container 4, the interior of the process container 4 can be continuously vacuum-exhausted over the entirety of the first to fourth steps T1 to T4.

In FIG. 3, the first step T1 is set to be within a range of about 1 to 20 seconds, and, for example, at about 10 seconds, the second step T2 is set to be within a range of about 5 to 15 seconds, and, for example, at about 10 seconds, the third step T3 is set to be within a range of about 1 to 30 seconds, and, for example, at about 20 seconds, the sub-step T3b is set to be within a range of about 1 to 25 seconds, and, for example, at about 10 seconds, and the fourth step T4 is set to be within a range of about 5 to 15 seconds, and, for example, at about 10 seconds. In general, the film thickness obtained by one cycle of the first to fourth steps T1 to T4 is about 0.11 to 0.13 nm. Accordingly, for example, where the target film thickness is 70 nm, the cycle is repeated about 600 times. However, these values of time and thickness are merely examples and thus are not limiting.

As described above, the step T1 of simultaneously supplying the first, third, and fourth process gases, and the step T3 of solely supplying the second process gas containing $NH_3$ gas and including a period of exciting the gas by plasma are alternately performed with the purge steps T2 and T4 respectively interposed therebetween. This makes it possible to greatly decrease the dielectric constant of a SiBCN film to be formed, and to greatly improve the etching resistance of the film in dry etching. This is thought to be caused due to the following reason. Specifically, in general, where a silicon nitride (SiN) film is doped with boron, the etching resistance thereof is deteriorated. However, as in the first embodiment, where the second process gas is excited by plasma when it is supplied, radicals (activated species) containing N radicals are generated and promote nitridation of the film. As a consequence, the number of Si—H bonds decreases while the number of Si—N bonds, which have high etching resistance, increases, in the film. As a consequence, the etching resistance of the film is greatly improved.

As described above, when the film is formed, a carbon hydride gas, such as $C_2H_4$ gas, is supplied into the process chamber 8, so that a silicon nitride film formed on the wafer surface is caused to contain carbon components. In this case, although the film formation temperature is set at, e.g., 550° C., which is lower than the conventional film formation temperature of, e.g., about 760° C., it is possible to decrease the etching rate of the film relative to dilute hydrofluoric acid used in a cleaning process or etching process performed on the surface of the film. As a result, the film is not excessively etched by cleaning, and thus the cleaning process is performed with high controllability in the film thickness. Further, the film can sufficiently serve as an etching stopper film or inter-level insulating film.

Furthermore, as described above, the second and fourth steps T2 and T4, which stop supply of the process gases between the first and second steps of performing supply of the process gases, serve as periods for reforming the film quality. The surface of an SiBCN film, formed immediately before each of these periods, is reformed in this period, thereby improving the film quality. Consequently, the etching rate of the SiBCN film is further decreased. The effect of the reformation process at an atomic level is thought to be as follows. Specifically, when an SiBCN film containing carbon atoms is formed, some of the Cl atoms derived from DCS gas are not desorbed but bonded in an activated state to the uppermost surface of this thin film. During the periods T2 and T4 of stopping supply of DCS gas, C atoms and N atoms derived from $C_2H_4$ gas and $NH_3$ gas replace Cl atoms on the uppermost surface of the thin film, and reduce Cl components in the film, thereby decreasing the etching rate.

Particularly, where $C_2H_4$ gas is used, the number of C atoms taken into the film is increased, thereby further decreasing the etching rate. Further, where carbon is added to a boron nitride film, the film formation rate is increased by about 20 to 30% as compared to a case where they are not added. This is thought to be due to the effect that carbon thus added promotes boron adsorption onto the wafer surface.

The process conditions of the film formation process are as follows. The flow rate of DCS gas is set to be within a range of 50 to 2,000 sccm, e.g., at 1,000 sccm (1 slm). The flow rate of $NH_3$ gas is set to be within a range of 500 to 5,000 sccm, e.g., at 1,000 sccm. The flow rate of $C_2H_4$ gas is set to be within a range of 200 to 2,000 sccm, e.g., at 500 sccm. The flow rate of $BCl_3$ gas is set to be within a range of 1 to 40 sccm, e.g., at 4 sccm. The flow rate of $C_2H_4$ gas is set to be not more than three times the flow rate of DCS gas. This is so because, if the flow rate of $C_2H_4$ gas used as a carbon hydride gas is excessively high, the film quality is undesirably drastically lowered.

The process temperature is lower than ordinary CVD processes, and is set to be within a range of 300 to 700° C., and preferably a range of 550 to 630° C. If the process temperature is lower than 300° C., essentially no film is deposited because hardly any reaction is caused. If the process temperature is higher than 700° C., a low quality CVD film is deposited, and existing films, such as a metal film, suffer thermal damage.

The process pressure is set to be within a range of 13 Pa (0.1 Torr) to 1,330 Pa (10 Torr), and preferably a range of 40 Pa (0.3 Torr) to 266 Pa (2 Torr). For example, the process pressure is set at 1 Torr during the first step (adsorption step) T1, and at 0.3 Torr during the third step (nitridation step using plasma) T3. If the process pressure is lower than 13 Pa, the film formation rate becomes lower than the practical level. Where the process pressure does not exceed 1,330 Pa, the reaction mode on the wafers W is mainly of an adsorption reaction, and thus a high quality thin film can be stably deposited at a high film formation rate, thereby attaining a good result. However, if the process pressure exceeds 1,330 Pa, the reaction mode is shifted from the adsorption reaction to a vapor-phase reaction, which then becomes prevailing on the wafers W. This is undesirable, because the inter-substrate uniformity and planar uniformity of the film are deteriorated, and the number of particles due to the vapor-phase reaction suddenly increases.

SECOND EMBODIMENT

In the film formation method according to a second embodiment, an insulating film of SiCN (silicon carbon nitride undoped with boron) is formed on semiconductor wafers by CVD. In order to achieve this, the first process gas containing dichlorosilane (DCS) gas as a silane family gas, the second process gas containing ammonia ($NH_3$) gas as a nitriding gas, and the third process gas containing $C_2H_4$ gas (ethylene gas) as a carbon hydride gas are selectively supplied into the process field 5 accommodating wafers W.

Specifically, in the second embodiment, the method according to the first embodiment shown in FIG. 3 is modified to exclude supply of the fourth process gas containing $BCl_3$ gas as a boron-containing gas, in performing film formation. Accordingly, the fourth process gas supply circuit 32 of the film formation apparatus shown in FIG. 1 is not needed to implement the second embodiment. The second embodiment employs the same process conditions as those of the first embodiment except for conditions concerning the fourth process gas.

Figure 4:
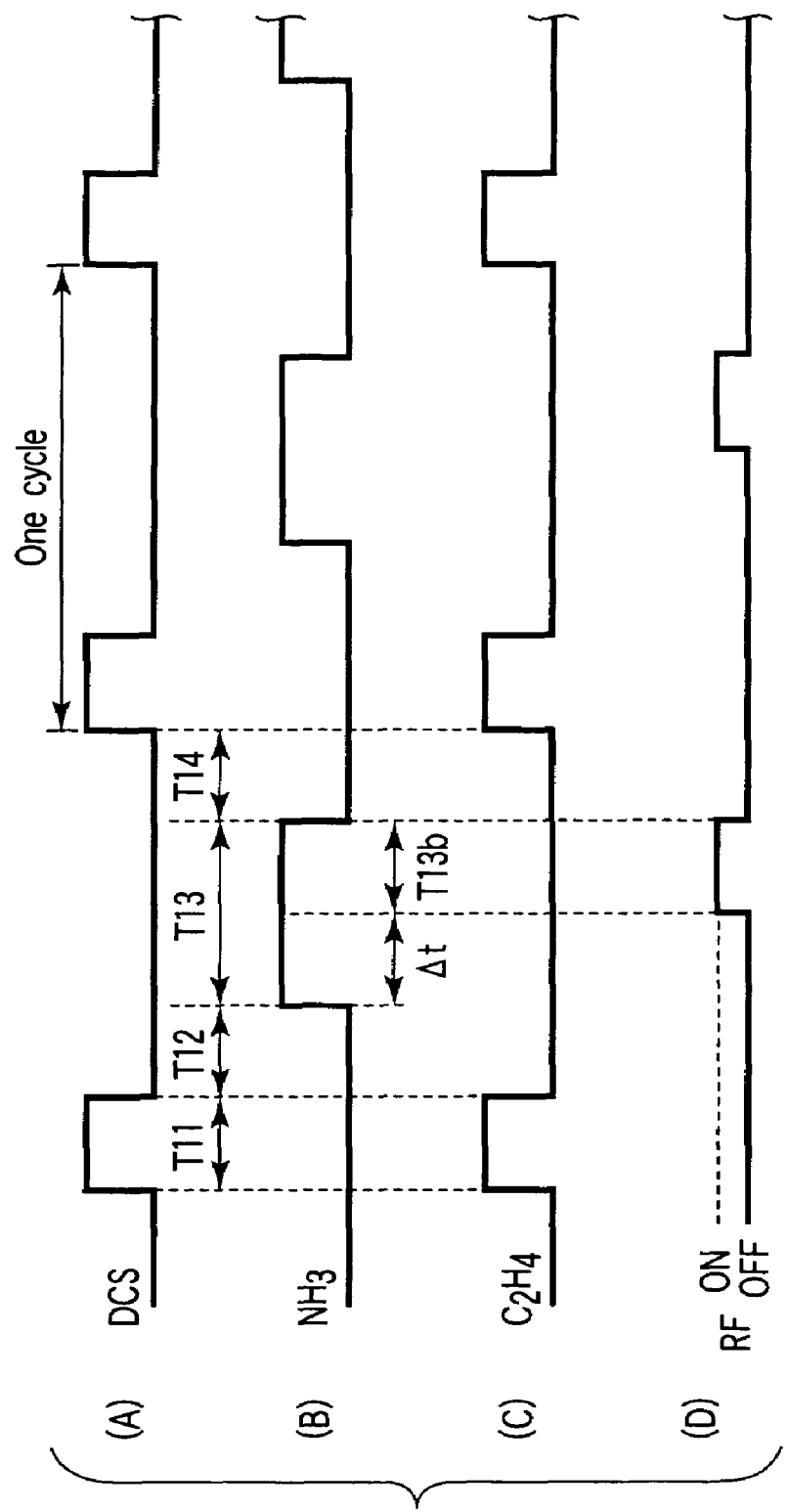
FIG. 4 is a timing chart of the gas supply and RF (radio frequency) application of a film formation method according to a second embodiment of the present invention.

FIG. 4 is a timing chart of the gas supply and RF (radio frequency) application of a film formation method according to the second embodiment of the present invention. As shown in FIG. 4, the film formation method according to this embodiment is also arranged to alternately repeat first to fourth steps T11 to T14. A cycle comprising the first to fourth steps T11 to T14 is repeated a number of times, and thin films of SiCN formed by respective cycles are laminated, thereby arriving at an SiCN film having a target thickness.

Specifically, the first step T11 is arranged to perform supply of the first process gas (denoted as DCS in FIG. 4) and the third process gas (denoted as $C_2H_4$ in FIG. 4) to the process field 5, while stopping supply of the second process gas (denoted as $NH_3$ in FIG. 4) to the process field 5. The second step T12 is arranged to stop supply of the first, second, and third process gases to the process field 5. The third step T13 is arranged to perform supply of the second process gas to the process field 5, while stopping supply of the first and third process gases to the process field 5. Further, halfway through the third step T13, the RF power supply 76 is set in the ON state to turn the second process gas into plasma by the gas exciting section 66, so as to supply the second process gas in an activated state to the process field 5 during a sub-step T13b. The fourth step T14 is arranged to stop supply of the first, second, and third process gases to the process field 5.

Also in the second embodiment, since the second process gas is excited by plasma when it is supplied, radicals (activated species) containing N radicals are generated and promote nitridation of the film. As a consequence, the number of Si—H bonds decreases while the number of Si—N bonds, which have high etching resistance, increases, in the film. Further, when the film is formed, a carbon hydride gas, such as $C_2H_4$ gas, is supplied into the process chamber 8, so that a silicon nitride film formed on the wafer surface is caused to contain carbon components. In this case, although the film formation temperature is set at, e.g., 550° C., which is lower than the conventional film formation temperature of, e.g., about 760° C., it is possible to decrease the etching rate of the film relative to dilute hydrofluoric acid used in a cleaning process or etching process performed on the surface of the film. As a result, the film is not excessively etched by cleaning, and thus the cleaning process is performed with high controllability in the film thickness. Further, the film can sufficiently serve as an etching stopper film or inter-level insulating film.

THIRD EMBODIMENT

In the film formation method according to a third embodiment, an insulating film of BCN (boron doped carbon nitride) is formed on semiconductor wafers by CVD. In order to achieve this, the second process gas containing ammonia ($NH_3$) gas as a nitriding gas, the third process gas containing $C_2H_4$ gas (ethylene gas) as a carbon hydride gas, and the fourth process gas containing $BCl_3$ gas as a boron-containing gas are selectively supplied into the process field 5 accommodating wafers W.

Specifically, in the third embodiment, the method according to the first embodiment shown in FIG. 3 is modified to exclude supply of the first process gas containing dichlorosilane (DCS) gas as a silane family gas, in performing film formation. Accordingly, the first process gas supply circuit 30 of the film formation apparatus shown in FIG. 1 is not needed to implement the third embodiment. The third embodiment employs the same process conditions as those of the first embodiment except for conditions concerning the first process gas.

FIG. 5 is a timing chart of the gas supply and RF (radio frequency) application of a film formation method according to the third embodiment of the present invention. As shown in FIG. 5, the film formation method according to this embodiment is also arranged to alternately repeat first to fourth steps T21 to T24. A cycle comprising the first to fourth steps T21 to T24 is repeated a number of times, and thin films of BCN formed by respective cycles are laminated, thereby arriving at a BCN film having a target thickness.

Specifically, the first step T21 is arranged to perform supply of the third process gas (denoted as $C_2H_4$ in FIG. 5) and the fourth process gas (denoted as $BCl_3$ in FIG. 5) to the process field 5, while stopping supply of the second process gas (denoted as $NH_3$ in FIG. 5) to the process field 5. The second step T22 is arranged to stop supply of the second, third, and fourth process gases to the process field 5. The third step T23 is arranged to perform supply of the second process gas to the process field 5, while stopping supply of the third and fourth process gases to the process field 5. Further, halfway through the third step T23, the RF power supply 76 is set in the ON state to turn the second process gas into plasma by the gas exciting section 66, so as to supply the second process gas in an activated state to the process field 5 during a sub-step T23b. The fourth step T24 is arranged to stop supply of the second, third, and fourth process gases to the process field 5.

Also in the third embodiment, since the second process gas is excited by plasma when it is supplied, radicals (activated species) containing N radicals are generated and promote nitridation of the film. As a consequence, the number of C—H bonds decreases while the number of C—N bonds, which have high etching resistance, increases, in the film. In this case, although the film formation temperature is set at, e.g., 550° C., which is lower than the conventional film formation temperature of, e.g., about 760° C., it is possible to decrease the etching rate of the film relative to dilute hydrofluoric acid used in a cleaning process or etching process performed on the surface of the film. As a result, the film is not excessively etched by cleaning, and thus the cleaning process is performed with high controllability in the film thickness. Further, the film can sufficiently serve as an etching stopper film or inter-level insulating film.

FOURTH EMBODIMENT

In the film formation method according to a fourth embodiment, an insulating film having a multi-layer structure consisting of SiBN (boron doped silicon nitride) thin films and SiCN (silicon carbon nitride) thin films alternately stacked is formed on semiconductor wafers by CVD. In order to achieve this, the first process gas containing dichlorosilane (DCS) gas as a silane family gas, the second process gas containing ammonia ($NH_3$) gas as a nitriding gas, the third process gas containing $C_2H_4$ gas (ethylene gas) as a carbon hydride gas, and the fourth process gas containing $BCl_3$ gas as a boron-containing gas are selectively supplied into the process field 5 accommodating wafers W.

Specifically, in the fourth embodiment, the method according to the first embodiment shown in FIG. 3 is modified to alternately perform a first cycle excluding supply of the third process gas containing $C_2H_4$ gas (ethylene gas) as a carbon hydride gas, and a second cycle excluding supply of the fourth process gas containing $BCl_3$ gas as a boron-containing gas, in performing film formation. The fourth embodiment employs the same process conditions as those of the first embodiment except that the first cycle and the second cycle are alternately performed.

Figure 7:
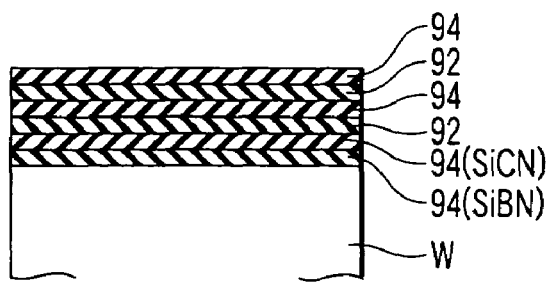
FIG. 7 is a sectional view showing an example of a multi-layer structure of thin films formed according to the fourth embodiment.

FIG. 7 is a sectional view showing an example of the multi-layer structure of thin films formed according to the fourth embodiment. As shown in FIG. 7, SiBN thin films 92 and SiCN thin films 94 are alternately stacked on a semiconductor wafer W. This SiBN/SiCN multi-layer structure film provides properties similar to those of a SiBCN film as a whole. The state shown in FIG. 7 is obtained by repeating the set of the first and second cycles three times.

Figure 6:
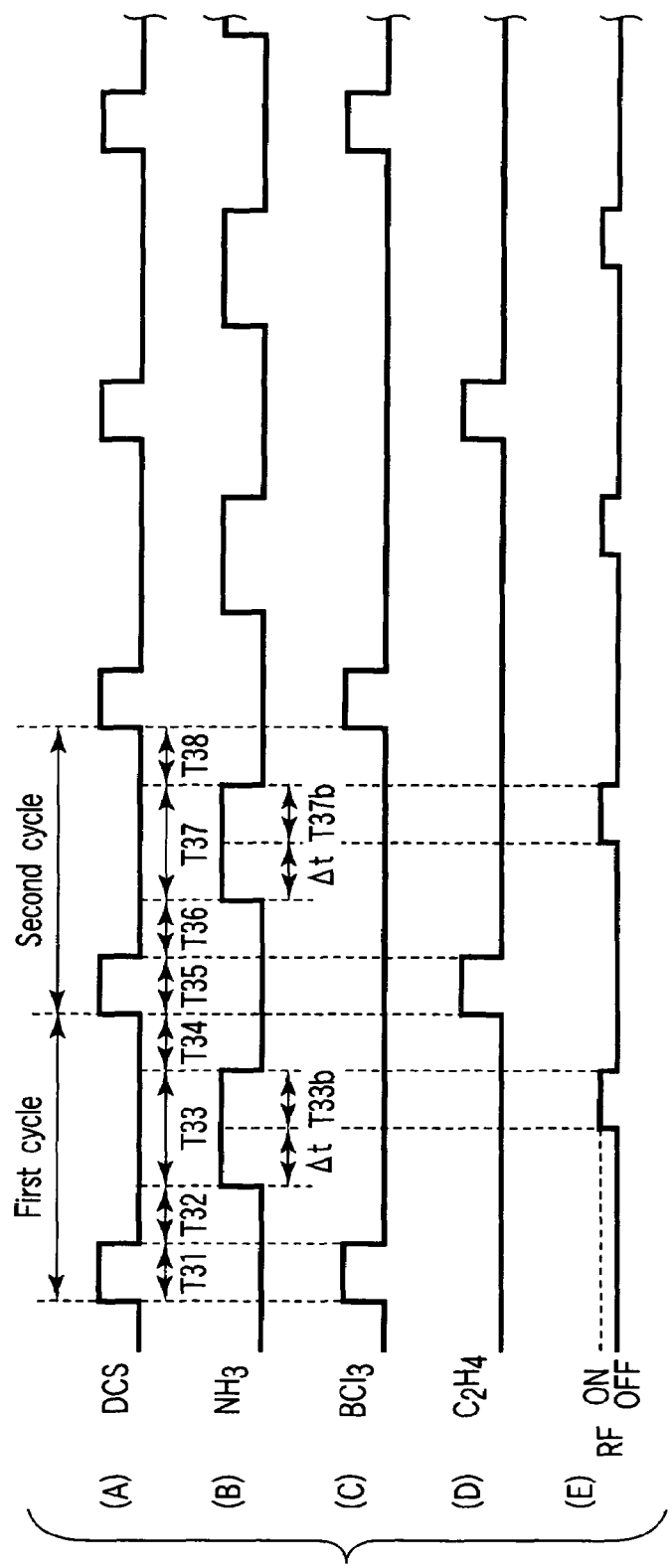
FIG. 6 is a timing chart of the gas supply and RF (radio frequency) application of a film formation method according to a fourth embodiment of the present invention.

FIG. 6 is a timing chart of the gas supply and RF (radio frequency) application of a film formation method according to the fourth embodiment of the present invention. As shown in FIG. 6, the film formation method according to this embodiment is arranged to alternately repeat the first cycle consisting of the first to fourth steps T31 to T34 and the second cycle consisting of the fifth to eighth steps T35 to T38. The first and second cycles are repeated a number of times, and thin films of SiBN and thin films of SiCN formed by respective cycles are laminated, thereby arriving at an SiBN/SiCN film having a target thickness. It should be noted that the order of the first and second cycles may be reversed (i.e., the second cycle starts first).

Specifically, at first, the first cycle consisting of the first to fourth steps T31 to T34 is performed. The first step T31 is arranged to perform supply of the first process gas (denoted as DCS in FIG. 6) and the fourth process gas (denoted as $BCl_3$ in FIG. 6) to the process field 5, while stopping supply of the second process gas (denoted as $NH_3$ in FIG. 6) and the third process gas (denoted as $C_2H_4$ in FIG. 6) to the process field 5. The second step T32 is arranged to stop supply of the first, second, third, and fourth process gases to the process field 5. The third step T33 is arranged to perform supply of the second process gas to the process field 5, while stopping supply of the first, third, and fourth process gases to the process field 5. Further, halfway through the third step T33, the RF power supply 76 is set in the ON state to turn the second process gas into plasma by the gas exciting section 66, so as to supply the second process gas in an activated state to the process field 5 during a sub-step T33b. The fourth step T34 is arranged to stop supply of the first, second, third, and fourth process gases to the process field 5.

Then, the second cycle consisting of the fifth to eighth steps T35 to T38 is performed. The fifth step T35 is arranged to perform supply of the first and third process gases to the process field 5, while stopping supply of the second and fourth process gases to the process field 5. The sixth step T36 is arranged to stop supply of the first, second, third, and fourth process gases to the process field 5. The seventh step T37 is arranged to perform supply of the second process gas to the process field 5, while stopping supply of the first, third, and fourth process gases to the process field 5. Further, halfway through the seventh step T37, the RF power supply 76 is set in the ON state to turn the second process gas into plasma by the gas exciting section 66, so as to supply the second process gas in an activated state to the process field 5 during a sub-step T37b. The eighth step T38 is arranged to stop supply of the first, second, third, and fourth process gases to the process field 5.

Also in the fourth embodiment, since the second process gas is excited by plasma when it is supplied, radicals (activated species) containing N radicals are generated and promote nitridation of the film. Further, when the film is formed, a carbon hydride gas, such as $C_2H_4$ gas, is supplied into the process chamber 8, so that a silicon nitride film formed on the wafer surface is caused to contain carbon components. In this case, although the film formation temperature is set at, e.g., 550° C., which is lower than the conventional film formation temperature of, e.g., about 760° C., it is possible to decrease the etching rate of the film relative to dilute hydrofluoric acid used in a cleaning process or etching process performed on the surface of the film. As a result, the film is not excessively etched by cleaning, and thus the cleaning process is performed with high controllability in the film thickness. Further, the film can sufficiently serve as an etching stopper film or inter-level insulating film. Furthermore, since the film is doped with boron, the etching resistance thereof is further improved.

<Experiment 1>

Using the apparatus shown in FIG. 1, an insulating film was formed in accordance with each of the film formation methods according to the first to third embodiments, and then the film thus formed was examined. In this experiment, the process conditions described above were employed as the reference for the film formation process, while the film formation temperature was set at 550° C. and a solution containing 1% of dilute hydrofluoric acid was used as an etching solution.

Figure 8:
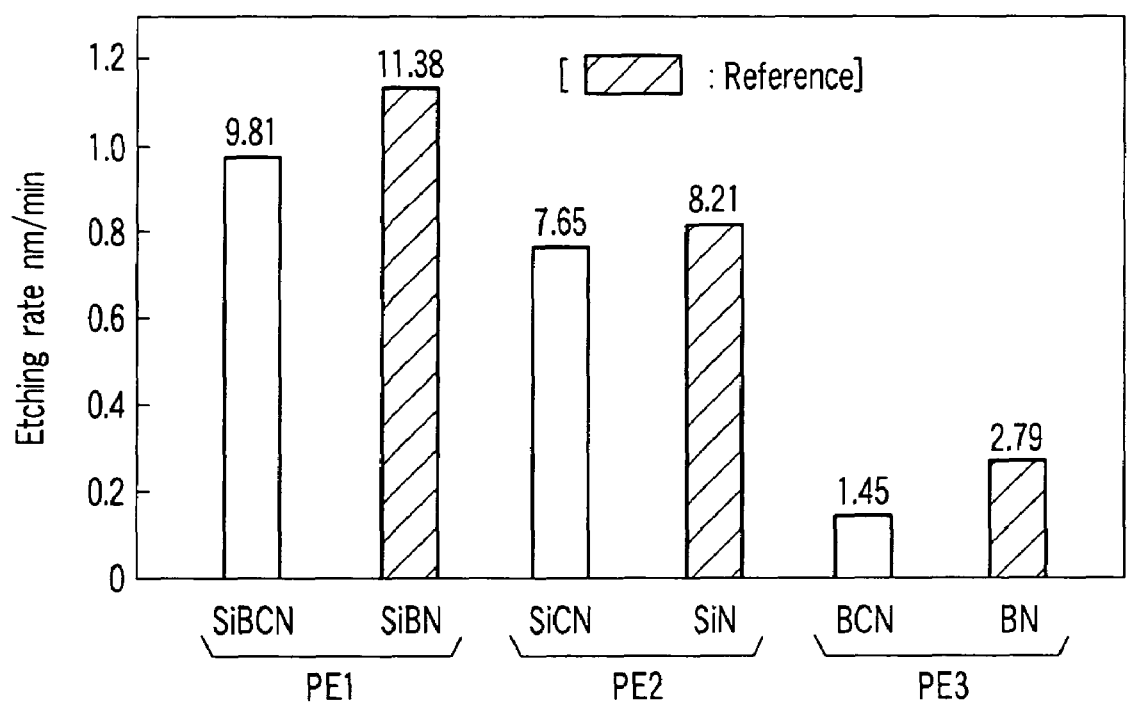
FIG. 8 is a graph showing examination results concerning the etching rate of thin films of three present examples PE1, PE2, and PE3 according to the first to third embodiments, respectively.

FIG. 8 is a graph showing examination results concerning the etching rate of thin films of three present examples PE1, PE2, and PE3 according to the first to third embodiments, respectively. Accordingly, the thin films of the present examples PE1, PE2, and PE3 were an SiBCN thin film, an SiCN thin film, and a BCN thin film, respectively. FIG. 8 shows the etching rate of each of the films and the etching rate (reference) obtained if the film contains no carbon (C) components.

As shown in FIG. 8, all the films containing carbon components rendered lower etching rates and thus had improved film quality, as compared to the corresponding films containing no carbon components. For example, the SiBCN thin film showed 13.8% improvement in etching rate over the SiBN thin film. The SiCN thin film showed 6.8% improvement in etching rate over the SiN thin film. The BCN thin film showed 48% improvement in etching rate over the BN thin film. Accordingly, it has been confirmed that addition of carbon to these films is effective.

<Common Matters to First to Fourth Embodiments>

Figure 9:
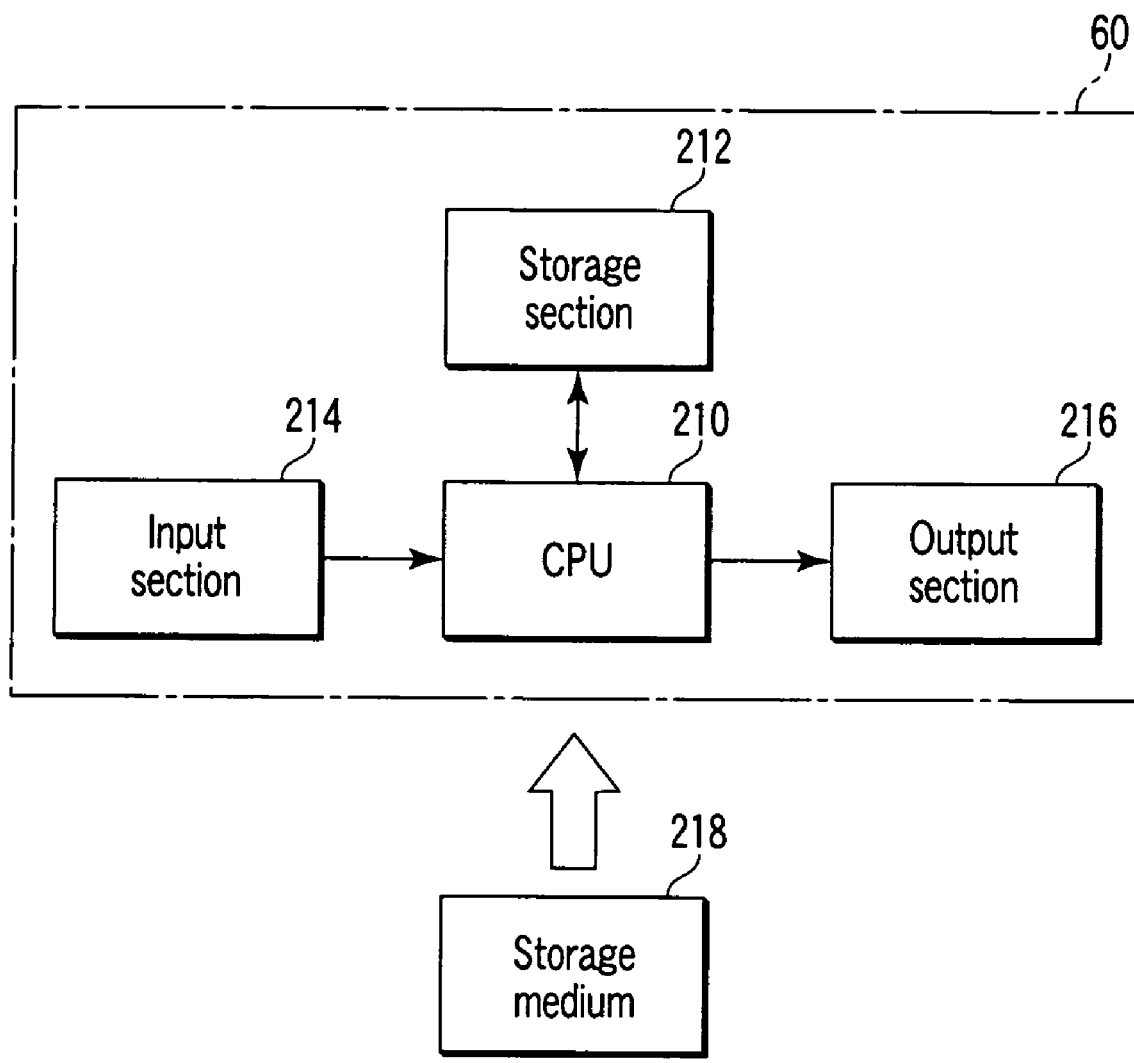
FIG. 9 is a block diagram schematically showing the structure of a main control section.

Each of the methods according to the first to fourth embodiments is performed under the control of the main control section 60 in accordance with a process program, as described above. FIG. 9 is a block diagram schematically showing the structure of the main control section 60. The main control section 60 includes a CPU 210, which is connected to a storage section 212, an input section 214, and an output section 216. The storage section 212 stores process programs and process recipes. The input section 214 includes input devices, such as a keyboard, a pointing device, and a storage media drive, to interact with an operator. The output section 216 outputs control signals for controlling components of the processing apparatus. FIG. 9 also shows a storage medium 218 attached to the computer in a removable state.

Each of the methods according to the first to fourth embodiments may be written as program instructions for execution on a processor, into a computer readable storage medium or media to be applied to a semiconductor processing apparatus. Alternately, program instructions of this kind may be transmitted by a communication medium or media and thereby applied to a semiconductor processing apparatus. Examples of the storage medium or media are a magnetic disk (flexible disk, hard disk (a representative of which is a hard disk included in the storage section 212), etc.), an optical disk (CD, DVD, etc.), a magneto-optical disk (MO, etc.), and a semiconductor memory. A computer for controlling the operation of the semiconductor processing apparatus reads program instructions stored in the storage medium or media, and executes them on a processor, thereby performing a corresponding method, as described above.

In the embodiments described above, for example, the exciting section 66 for generating plasma of the film formation apparatus 2 is integrally combined with the process container 4. Alternatively, the exciting section 66 may be separately disposed from the process container 4, so as to excite $NH_3$ gas outside the process container 4 (so called remote plasma), and then supply the excited $NH_3$ gas into the process container 4. Further, $NH_3$ gas may be supplied without being activated, but, in this case, the process temperature needs to be increased to some extent to compensate for energy decrease due to no plasma being used.

In the embodiments described above, for example, the first process gas contains DCS gas as a silane family gas. In this respect, the silane family gas may be one or more gases selected from the group consisting of dichlorosilane (DCS), hexachlorodisilane (HCD), monosilane ($SiH_4$), disilane ($Si_2Cl_6$), hexamethyl-disilazane (HMDS), tetrachlorosilane (TCS), disilylamine (DSA), trisilylamine (TSA), bistertial-butylaminosilane (BTBAS).

In the embodiments described above, the second process gas contains a nitriding gas, which may be $NH_3$ gas or $N_2$ gas. Where the present invention is applied to formation of a film based on silicon oxynitride, an oxynitriding gas, such as dinitrogen oxide ($N_2O$) or nitrogen oxide (NO), may be used in place of the nitriding gas. In this case, a film to be formed is a film based on silicon oxynitride that contains oxygen (O).

In the embodiments described above, for example, the third process gas contains ethylene gas as a carbon hydride gas. In this respect, the carbon hydride gas may be one or more gases selected from the group consisting of acetylene, ethylene, methane, ethane, propane, and butane.

In the embodiments described above, for example, the fourth process gas contains $BCl_3$ gas as a boron-containing gas. In this respect, the boron-containing gas may be one or more gases selected from the group consisting of $BCl_3$, $B_2H_6$, $BF_3$, and $B(CH_3)_3$.

A target substrate is not limited to a semiconductor wafer, and it may be another substrate, such as an LCD substrate or glass substrate.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A film formation method for a semiconductor process for forming an insulating film on a target substrate by CVD, in a process field configured to be selectively supplied with a first process gas containing a silane family gas, a second process gas containing a nitriding gas or oxynitriding gas, and a third process gas containing a carbon hydride gas, the method alternately comprising:
   a first step of performing supply of the first and third process gases to the process field while stopping supply of the second process gas to the process field;
   a second step of stopping supply of the first, second, and third process gases to the process field;
   a third step of performing supply of the second process gas to the process field while stopping supply of the first and third process gases to the process field; and
   a fourth step of stopping supply of the first, second, and third process gases to the process field.

2. The method according to claim 1, wherein the third step comprises an excitation period of supplying the second process gas to the process field while exciting the second process gas by an exciting mechanism.

3. The method according to claim 2, wherein the third step further comprises a period of supplying the second process gas to the process field while not exciting the second process gas by the exciting mechanism, before the excitation period.

4. The method according to claim 1, wherein the process field is configured to be selectively supplied with a fourth process gas containing a boron-containing gas, and the method comprises a period of supplying the fourth process gas to the process field.

5. The method according to claim 4, wherein supply of the fourth process gas to the process field is performed and stopped simultaneously with supply of the first and third process gases to the process field.

6. The method according to claim 4, wherein the first step is arranged to perform supply of the first and third process gases to the process field while stopping supply of the second and fourth process gases to the process field,
   the second step is arranged to stop supply of the first, second, third, and fourth process gases to the process field,
   the third step is arranged to perform supply of the second process gas to the process field while stopping supply of the first, third, and fourth process gases to the process field,
   the fourth step is arranged to stop supply of the first, second, third, and fourth process gases to the process field, and
   after the first to fourth steps, the method further alternately comprises:
   a fifth step of performing supply of the first and fourth process gases to the process field while stopping supply of the second and third process gases to the process field;
   a sixth step of stopping supply of the first, second, third, and fourth process gases to the process field;
   a seventh step of performing supply of the second process gas to the process field while stopping supply of the first, third, and fourth process gases to the process field; and
   an eighth step of stopping supply of the first, second, third and fourth process gases to the process field.

7. The method according to claim 6, wherein the seventh step comprises an excitation period of supplying the second process gas to the process field while exciting the second process gas by an exciting mechanism.

8. The method according to claim 7, wherein the seventh step further comprises a period of supplying the second process gas to the process field while not exciting the second process gas by the exciting mechanism, before the excitation period.

9. The method according to claim 4, wherein the fourth process gas contains at least one gas selected from the group consisting of $BCl_3$, $B_2H_6$, $BF_3$, and $B(CH_3)_3$.

10. The method according to claim 1, wherein each of the second and fourth steps comprises a period of supplying a purge gas to the process field.

11. The method according to claim 1, wherein gas inside the process field is kept exhausted from the first step to the fourth step.

12. The method according to claim 1, wherein the first process gas contains at least one gas selected from the group consisting of dichlorosilane, hexachlorodisilane, monosilane, disilane, hexamethyldisilazane, tetrachlorosilane, disilylamine, trisilylamine, and bistertialbutylaminosilane, the second process gas contains at least one gas selected from the group consisting of ammonia, nitrogen, dinitrogen oxide, and nitrogen oxide, and the third process gas contains at least one gas selected from the group consisting of acetylene, ethylene, methane, ethane, propane, and butane.

13. A film formation method for a semiconductor process for forming an insulating film on a target substrate by CVD, in a process field configured to be selectively supplied with a first process gas containing a carbon hydride gas, a second process gas containing a nitriding gas or oxynitriding gas, and a third process gas containing a boron-containing gas, the method alternately comprising:
  a first step of performing supply of the first and third process gases to the process field while stopping supply of the second process gas to the process field;
  a second step of stopping supply of the first, second, and third process gases to the process field;
  a third step of performing supply of the second process gas to the process field while stopping supply of the first and third process gases to the process field; and
  a fourth step of stopping supply of the first, second, and third process gases to the process field.

14. The method according to claim 13, wherein the third step comprises an excitation period of supplying the second process gas to the process field while exciting the second process gas by an exciting mechanism.

15. The method according to claim 14, wherein the third step further comprises a period of supplying the second process gas to the process field while not exciting the second process gas by the exciting mechanism, before the excitation period.

16. The method according to claim 13, wherein each of the second and fourth steps comprises a period of supplying a purge gas to the process field.

17. The method according to claim 13, wherein gas inside the process field is kept exhausted from the first step to the fourth step.

18. The method according to claim 13, wherein the first process gas contains at least one gas selected from the group consisting of acetylene, ethylene, methane, ethane, propane, and butane, the second process gas contains at least one gas selected from the group consisting of ammonia, nitrogen, dinitrogen oxide, and nitrogen oxide, and the third process gas contains at least one gas selected from the group consisting of $BCl_3$, $B_2H_6$, $BF_3$, and $B(CH_3)_3$.

19. A film formation apparatus for a semiconductor process, comprising:
  a process container having a process field configured to accommodate a target substrate;
  a support member configured to support the target substrate inside the process field;
  a heater configured to heat the target substrate inside the process field;
  an exhaust system configured to exhaust gas inside the process field;
  a first process gas supply circuit configured to supply a first process gas containing a silane family gas to the process field;
  a second process gas supply circuit configured to supply a second process gas containing a nitriding gas or oxynitriding gas to the process field;
  a third process gas supply circuit configured to supply a third process gas containing a carbon hydride gas to the process field; and
  a control section configured to control an operation of the apparatus,
  wherein, in order to form an insulating film on the target substrate by CVD, the control section alternately executes
  a first step of performing supply of the first and third process gases to the process field while stopping supply of the second process gas to the process field;
  a second step of stopping supply of the first, second, and third process gases to the process field;
  a third step of performing supply of the second process gas to the process field while stopping supply of the first and third process gases to the process field; and
  a fourth step of stopping supply of the first, second, and third process gases to the process field.

20. A film formation apparatus for a semiconductor process, comprising:
  a process container having a process field configured to accommodate a target substrate;
  a support member configured to support the target substrate inside the process field;
  a heater configured to heat the target substrate inside the process field;
  an exhaust system configured to exhaust gas inside the process field;
  a first process gas supply circuit configured to supply a first process gas containing a carbon hydride gas to the process field;
  a second process gas supply circuit configured to supply a second process gas containing a nitriding gas or oxynitriding gas to the process field;
  a third process gas supply circuit configured to supply a third process gas containing a boron-containing gas to the process field; and
  a control section configured to control an operation of the apparatus,
  wherein, in order to form an insulating film on the target substrate by CVD, the control section alternately executes
  a first step of performing supply of the first and third process gases to the process field while stopping supply of the second process gas to the process field;
  a second step of stopping supply of the first, second, and third process gases to the process field;

a third step of performing supply of the second process gas to the process field while stopping supply of the first and third process gases to the process field; and a fourth step of stopping supply of the first, second, and third process gases to the process field.

21. A computer readable medium containing program instructions for execution on a processor, which is used for a film formation apparatus for a semiconductor process for forming an insulating film on a target substrate by CVD, in a process field configured to be selectively supplied with a first process gas containing a silane family gas, a second process gas containing a nitriding gas or oxynitriding gas, and a third process gas containing a carbon hydride gas, wherein the program instructions, when executed by the processor, cause the film formation apparatus to execute a first step of performing supply of the first and third process gases to the process field while stopping supply of the second process gas to the process field;

a second step of stopping supply of the first, second, and third process gases to the process field;

a third step of performing supply of the second process gas to the process field while stopping supply of the first and third process gases to the process field; and a fourth step of stopping supply of the first, second, and third process gases to the process field.

22. A computer readable medium containing program instructions for execution on a processor, which is used for a film formation apparatus for a semiconductor process for forming an insulating film on a target substrate by CVD, in a process field configured to be selectively supplied with a first process gas containing a carbon hydride gas, a second process gas containing a nitriding gas or oxynitriding gas, and a third process gas containing a boron-containing gas, wherein the program instructions, when executed by the processor, cause the film formation apparatus to execute a first step of performing supply of the first and third process gases to the process field while stopping supply of the second process gas to the process field;

a second step of stopping supply of the first, second, and third process gases to the process field;

a third step of performing supply of the second process gas to the process field while stopping supply of the first and third process gases to the process field; and a fourth step of stopping supply of the first, second, and third process gases to the process field.

* * * * *